US010971599B2

(12) United States Patent
Thees (10) Patent No.: US 10,971,599 B2
(45) Date of Patent: Apr. 6, 2021

(54) POWER SEMICONDUCTOR DEVICE WITH SELF-ALIGNED SOURCE REGION

(71) Applicant: Infineon Technologies AG, Neubiberg (DE)

(72) Inventor: Hans-Juergen Thees, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/545,231

(22) Filed: Aug. 20, 2019

(65) Prior Publication Data

US 2020/0066870 A1 Feb. 27, 2020

(30) Foreign Application Priority Data

Aug. 22, 2018 (DE) .................. 102018120433.7

(51) Int. Cl.
| | |
|---|---|
| H01L 21/768 | (2006.01) |
| H01L 29/66 | (2006.01) |
| H01L 21/02 | (2006.01) |
| H01L 21/265 | (2006.01) |
| H01L 29/78 | (2006.01) |
| H01L 21/266 | (2006.01) |
| H01L 29/06 | (2006.01) |

(Continued)

(52) U.S. Cl.
CPC ...... *H01L 29/6634* (2013.01); *H01L 21/0217* (2013.01); *H01L 21/266* (2013.01); *H01L 21/26513* (2013.01); *H01L 21/26586* (2013.01); *H01L 29/0696* (2013.01); *H01L 29/1095* (2013.01); *H01L 29/41741* (2013.01); *H01L 29/66727* (2013.01); *H01L 29/66734* (2013.01); *H01L 29/7397* (2013.01); *H01L 29/7813* (2013.01)

(58) Field of Classification Search
CPC ............ H01L 21/56586; H01L 21/047; H01L 21/76877; H01L 21/76883; H01L 29/42336; H01L 29/42352; H01L 29/4236
See application file for complete search history.

(56) References Cited

U.S. PATENT DOCUMENTS

| | | |
|---|---|---|
| 2007/0032020 A1 | 2/2007 | Grebs et al. |
| 2008/0035990 A1 | 2/2008 | Matsuura et al. |

(Continued)

*Primary Examiner* — Jae Lee
(74) *Attorney, Agent, or Firm* — Murphy, Bilak & Homiller, PLLC (57) ABSTRACT

An auxiliary layer is formed above a semiconductor body surface of a semiconductor body, the auxiliary layer being coupled to the semiconductor body and having an auxiliary layer surface. Trenches extend from the auxiliary layer surface along a vertical direction through the auxiliary layer into the semiconductor body, wherein two facing trench sidewalls of two adjacent trenches laterally confine a mesa region of the semiconductor body along a first lateral direction, each adjacent trench including a trench section protruding out of the semiconductor body surface. The trenches are filled with a trench filler material which is planarized to expose the auxiliary layer. The auxiliary layer is removed to least partially while maintaining the protruding trench sections. The mesa region is subjected to an implantation tilted by an angle of at least 10°, the protruding trench sections of the adjacent trenches serving at least partially as a mask during the implantation.

19 Claims, 7 Drawing Sheets

(51) Int. Cl.
  *H01L 29/10*  (2006.01)
  *H01L 29/417*  (2006.01)
  *H01L 29/739*  (2006.01)

(56) References Cited

U.S. PATENT DOCUMENTS

2016/0086804 A1 3/2016 Noguchi
2017/0221988 A1* 8/2017 Baumgartl .......... H01L 21/0257

* cited by examiner

POWER SEMICONDUCTOR DEVICE WITH SELF-ALIGNED SOURCE REGION

TECHNICAL FIELD

This specification refers to embodiments of a power semiconductor device and to embodiments of a method of processing a power semiconductor device. In particular, this specification refers to aspects of a new source region formation process and to corresponding devices.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode.

For example, upon receiving a corresponding control signal from, e.g., a driver unit, the control electrode may set the power semiconductor device in one of a conducting state and a blocking state. In some cases, the gate electrode may be included within a trench of the power semiconductor switch, wherein the trench may exhibit, e.g., a stripe configuration or a needle configuration.

It is usually desirable to keep losses, e.g., switching losses, on-state losses during a conducting state and off-state losses during a blocking state of the power semiconductor device low.

Further, a power semiconductor device shall usually exhibit a high reliability. To this end, accurate formation of doped semiconductor regions, e.g., in terms of their positions, is desirable.

SUMMARY

According to an embodiment, a method of forming a power semiconductor device comprises: providing a semiconductor body having a semiconductor body surface; forming an auxiliary layer above the semiconductor body surface, the auxiliary layer being coupled to the semiconductor body and having an auxiliary layer surface; forming a plurality of trenches, the trenches extending from the auxiliary layer surface along a vertical direction through the auxiliary layer into the semiconductor body, wherein two trench sidewalls facing to each other of two adjacent ones of the trenches laterally confine a mesa region of the semiconductor body along a first lateral direction, wherein both adjacent trenches comprise a respective trench section protruding out of the semiconductor body surface against the vertical direction by a protrusion distance of at least 50 nm; filling the trenches with at least one trench filler material; planarizing the at least one trench filler material to expose the auxiliary layer; removing the auxiliary layer at least partially while maintaining the protruding trench sections comprising the at least one trench filler material; subjecting the mesa region to an implantation processing step for forming a semiconductor zone in the mesa region, wherein the implantation is tilted with respect to the vertical direction by an angle of at least 10°, and wherein the protruding trench sections of the adjacent trenches serve at least partially as a mask during the tilted implantation.

According to another embodiment, a power semiconductor device comprises a semiconductor body, the semiconductor body being coupled to a first load terminal and a second load terminal and configured to conduct a load current between said terminals, wherein the power semiconductor device further comprises: a first trench and a second trench that extend into the semiconductor body along a vertical direction, wherein both trenches comprise respective trench sidewalls, wherein the trench sidewalls facing to each other laterally confine a mesa region of the semiconductor body along a first lateral direction; a respective trench electrode; a respective trench section protruding out of a surface of the semiconductor body against the vertical direction by a protrusion distance of at least 50 nm, wherein the trench electrodes extend into the protruding trench sections; a source region of a first conductivity type and a semiconductor body region of a second conductivity type, both regions being arranged in the mesa region adjacent to a trench sidewall of the first trench, wherein the first trench is configured for inducing an inversion channel in the body region to control a load current in the mesa region, wherein the source region is arranged adjacent to only one of the two trench sidewalls and spatially displaced along the first lateral direction from the other one of the two trench sidewalls.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor switch exhibiting a stripe cell or cellular cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, e.g., monolithically integrated cell of two anti-serially connected diodes, a monolithically integrated transistor cell, e.g., a monolithically integrated IGBT cell and/or derivatives thereof. Such diode/transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., up to at least 3 kV, or even up to 10 kV or more.

For example, the power semiconductor device described below may be a semiconductor device exhibiting a stripe cell configuration or a cellular (columnar/needle) cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor-based data processing.

Figure 2A:
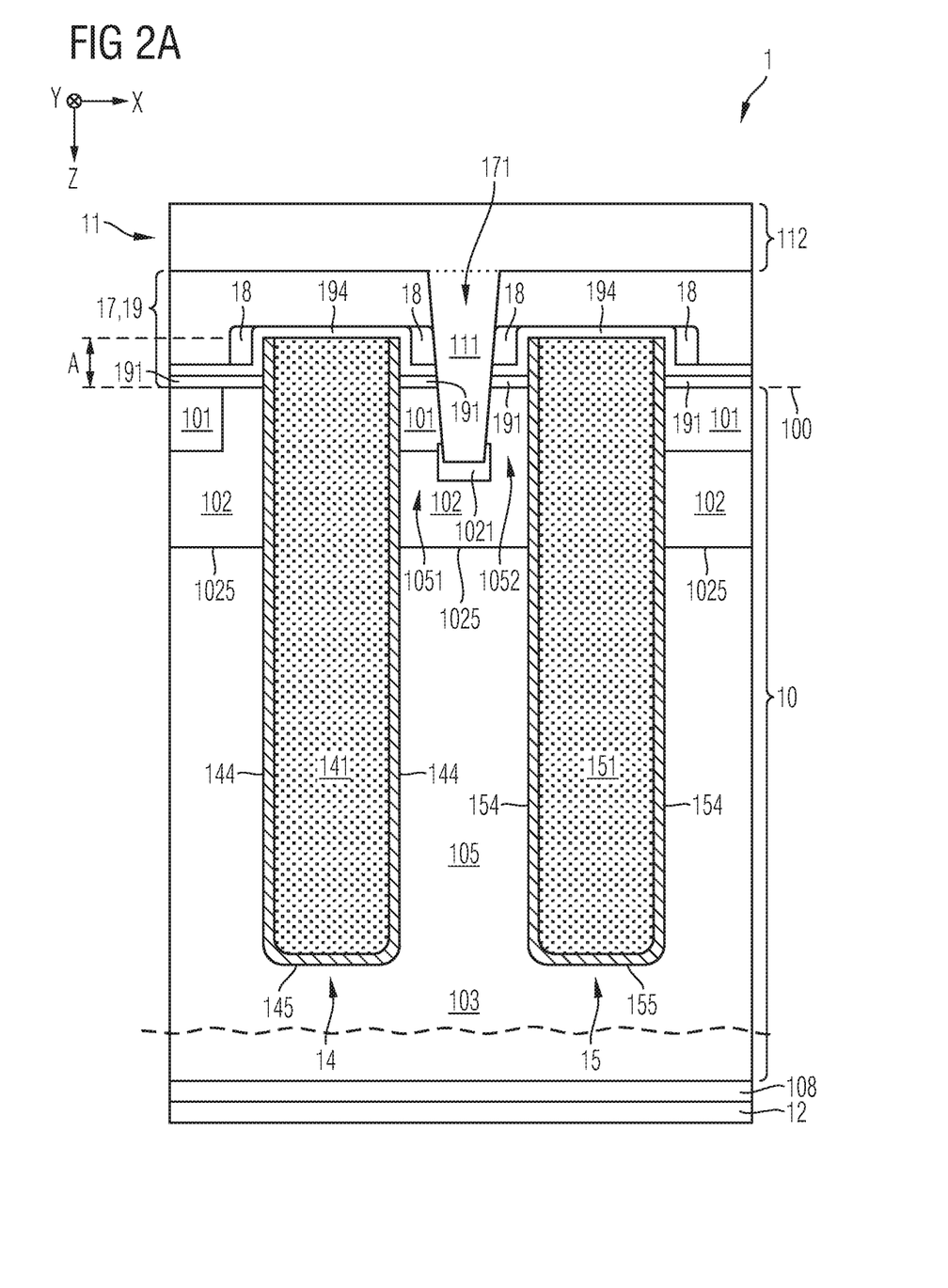
FIG. 2A schematically and exemplarily illustrates a section of a vertical cross-section of a power semiconductor device in accordance with one or more embodiments.
Figure 2B:
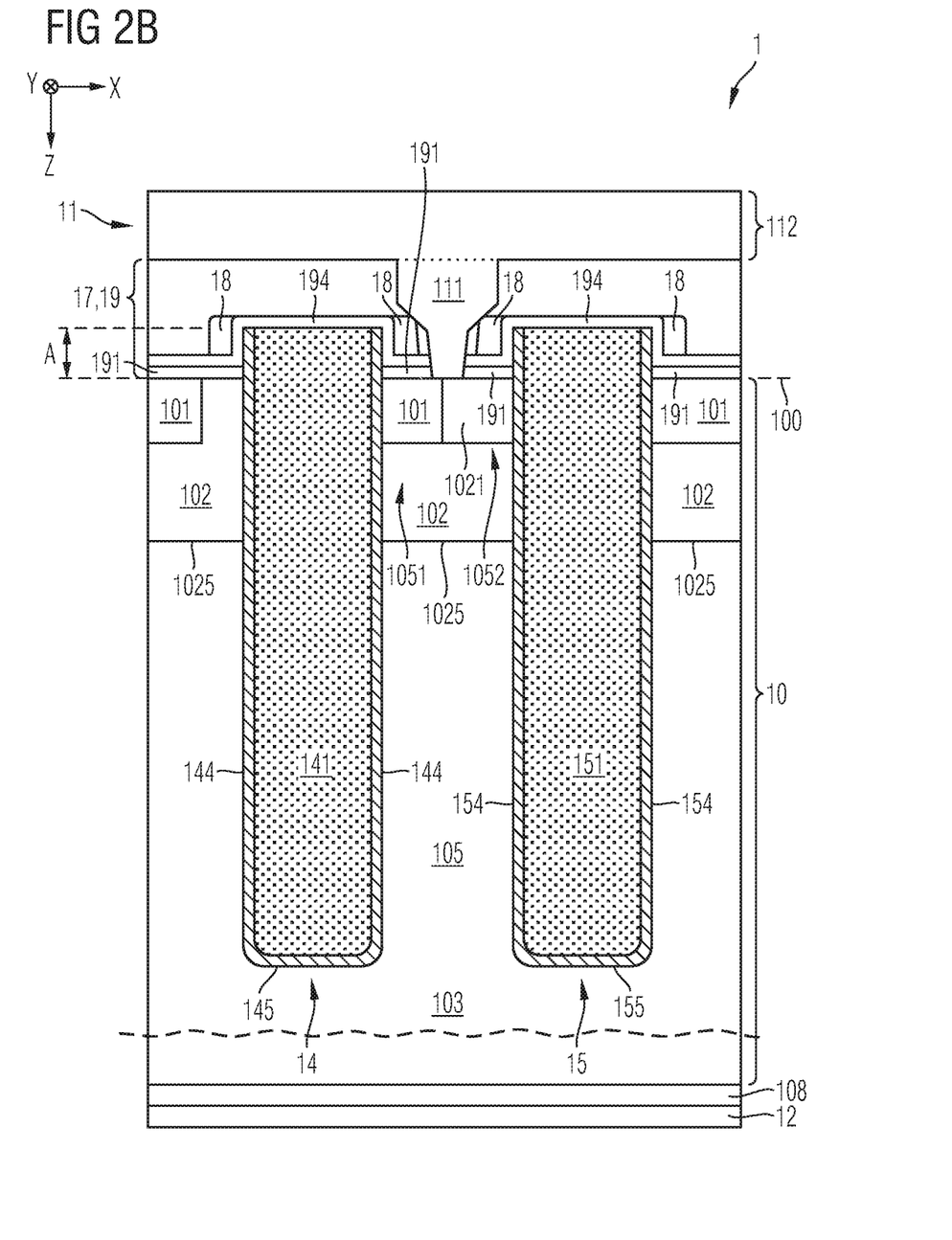
FIG. 2B schematically and exemplarily illustrates a section of a vertical cross-section of a power semiconductor device in accordance with one or more embodiments.

Both FIG. 2A and FIG. 2B schematically and exemplarily illustrate a power semiconductor device 1 in accordance with one or more embodiments. In the following, it will be referred to both of FIGS. 2A and 2B.

The power semiconductor device 1 has a semiconductor body 10, the semiconductor body 10 being coupled to a first load terminal 11 and a second load terminal 12 and configured to conduct a load current between said terminals 11, 12.

For example, the power semiconductor device 1 has a MOSFET configuration or an IGBT configuration or an RC-IGBT configuration or a configuration derived from one of these basic power semiconductor device configurations, such as an RC-IGBT with diode control (RCDC) configuration. Hence, the first load terminal 11 can be a source terminal or an emitter terminal, and the second load terminal 12 can be a drain terminal or a collector terminal.

The power semiconductor device 1 may have a vertical configuration, according to which the semiconductor body 10 is sandwiched between the first load terminal 11 and the second load terminal 12, and according to which the load current flows in a direction essentially in parallel to the vertical direction Z.

Depending on the configuration of the power semiconductor device 1, the semiconductor body 10 is provided with a plurality of doped regions.

For example, the main part of the semiconductor body 10 is formed by a drift region 103 of the first conductivity type, wherein the dopant concentration of the drift region 103 is rather low.

The drift region 103 may be coupled to the second load terminal 12 by means of a first doped region 108, which may comprise a first emitter region of the second conductivity type arranged in electrical contact with the second load terminal 12, e.g., in case of an IGBT configuration. In addition, the first doped region 108 may comprise second emitter regions of the first conductivity type that are also arranged in electrical contact with a second load terminal 12, e.g., so as to provide an RC-IGBT configuration. In addition to at least one of the first emitter region and the second emitter regions, the first contact region 108 may comprise a field stop region of the first conductivity type, wherein the field stop region may have higher dopant concentration of dopants of the first conductivity type as compared to the drift region. In another embodiment, the first doped region 108 is entirely a region of the first conductivity type, e.g. in case of a MOSFET configuration. In the context of IGBTs, RC-IGBTs and MOSFETs, the general functionality and configuration of the first doped region 108 is known to the skilled person, and in accordance with the embodiments described herein, is not deviated from this general functionality and configuration of the first doped region 108.

In the section of the semiconductor body 10 that interfaces with the first load terminal 11, a plurality of power cells may be formed. For example, the power semiconductor device 1 includes a plurality of equally configured power cells, e.g., at least 10, 100, or 1000 power cells, or at least 10,000 power cells or even more than 100,000 power cells.

For example, each power cell includes a plurality of trenches, e.g., at least one or more first trenches 14 and at least one or more second trenches 15, each extending from a surface 100 of the semiconductor body 10 along the vertical direction Z, wherein the trenches 14 and 15 laterally confine a mesa region 105 along the first lateral direction X. Of course, each power cell may comprise more than the illustrated two trenches 14 and 15 and, hence, also more than only one mesa region 105.

The trenches 14 and 15 may exhibit a stripe configuration according to which the lateral extension along the second lateral direction Y is significantly larger than the total extension along first lateral direction X, i.e., significantly larger than the trench width. In an embodiment, the trenches of the power cells each exhibit the same trench width (in the first lateral direction X), the same trench depth (in the vertical direction Z) and are spatially displaced from each other along the first lateral direction X according to a fixed pattern.

The trench width may be defined as the distance between the two trench sidewalls 144 (154, respectively) of each trench 14 (15, respectively), and the trench depth may be defined as a distance between the semiconductor body surface 100 and the trench bottom 145 (155, respectively).

Each trench 14, 15 may comprise a respective trench electrode 141, 151 and a respective trench insulator 142, 152 insulating the trench electrodes 141, 152 from the semiconductor body 10.

The above mentioned plurality of doped regions of the semiconductor body 10 may include a semiconductor source region 101 of the first conductivity type and a semiconductor body region 102 of the second conductivity type, both regions 101, 102 being arranged the mesa region 105 adjacent to the trench sidewall 144 of the first trench 14 and electrically connected to the first load terminal 11.

The semiconductor source region 101 typically, but not necessarily, exhibits a significantly greater dopant concentration as compared to the drift region 103. The source region 101 is arranged in electrical contact with the first load terminal 11. For example, the semiconductor source region 101 forms a part of the surface of the mesa region 105 that interfaces with the first load terminal 11. The first trench 14 may for example have the semiconductor source region 101 arranged adjacent to only one of its trench sidewalls 144, as illustrated, which will become more apparent from the subsequent description.

The semiconductor body region 102 (of the second conductivity type) typically, but not necessarily, exhibits a significantly greater dopant concentration as compared to the drift region 103, wherein the dopant concentration of the body region 102 may vary. For example, a subsection (also referred to as body contact region) 1021 of the body region 102 that interfaces with the first load terminal 11 may be stronger doped as compared to another subsection of the body region 102, as will be explained in more detail below.

The body region 102 is arranged in electrical contact with the first load terminal 11. For example, the semiconductor body region 102 also forms a part of the surface of the mesa region 105 that interfaces with the first load terminal 11. For example, the subsection 1021 of the semiconductor body region 102 that interfaces with the first load terminal 11 has a comparatively high dopant concentration as compared to the remaining part of the semiconductor body region 102.

The semiconductor body region 102 may extend throughout the entire width of the mesa region 105, as illustrated. The semiconductor body region 102 isolates the semiconductor source region 101 from the semiconductor drift region 103. A transition between the semiconductor body region 102 and the drift region 103 forms the pn-junction 1025, wherein the pn-junction 1025 can be arranged within the mesa regions 105.

The first trench 14 can be configured for inducing an inversion channel in the body region 102, e.g., in a subsection typically called channel region, to control a load current in the mesa region 105. For example, the inversion channel is formed in the channel region of the body region 102, wherein the channel region may be arranged adjacent to the trench sidewall 144 and may extend below the semiconductor source region 101.

By controlling the load current in each of the mesa regions 105 (of the power cells) which have a configuration as just described (in particular: both said source and body regions electrically connected to the first load terminal 11), the load current of the power semiconductor device 1 can be controlled.

For example, the trench electrode 141 of the first trench 14 is a gate electrode which receives, from a driver (not illustrated), a gate signal, e.g. formed by applying a voltage between a gate terminal (not illustrated) and the first load terminal 11, wherein the gate terminal may be electrically connected to the trench electrodes 141 of the first trenches 14.

Configurations of pn-isolations within mesa regions laterally confined by trenches, as described above, are known to the skilled person in the context of IGBTs, RC-IGBTs and MOSFETs, and in accordance with the embodiments described herein, is not deviated from this general functionality and configuration of such pn-isolations.

Each power cell of the power semiconductor device 1 may comprise more than only one mesa region 105, for example at least two or three or four mesa regions 105 or even more than four mesa regions 105, and a corresponding number of trenches. However, it shall be understood that not each mesa region 105 of a respective one of the power cells must be configured for conducting the load current. Rather, in accordance with some embodiments, one or more of the mesa regions 105 of the respective one of the power cells is not configured for conducting the load current, wherein such configuration may be achieved in different ways. For example, a (non-illustrated) mesa region is not configured for load current conduction if not electrically connected to the first load terminal 11. Additionally or alternatively, a mesa region is not configured for load current conduction if not equipped with a source region.

Further, with exemplary respect to the mesa region 105 arranged between the first trench 14 and the second trench 15, as illustrated in FIG. 2A/B, it shall be understood that along the second lateral direction Y, the mesa region 105 may change its configuration regarding capability of conducting the load current or not. E.g., this can be achieved by structuring the semiconductor source region 101 along the second lateral direction Y.

At least one or more of the optional other second trenches 15 of each power cell, e.g., the second trench 15 adjacent to the mesa region 105 including the source region 101, can be a source trench whose trench electrode 151 is electrically connected or at least electrically coupled to the first load terminal 11.

One or more of the optional (non-illustrated) other second trenches 15 can, but must not necessarily be different from both a source trench and a gate trench. For example, further trench types may be provided for forming the power cells, e.g., trenches with electrically floating electrodes, trenches that have gate electrodes that are not arranged adjacent to semiconductor source region (so-called dummy gate trenches) and the like.

Hence, in view of the explanation above regarding the different configurations of the mesa regions and the trenches, the power cells of the semiconductor device 1 may be configured in accordance with various so-called contacting schemes, i.e., schemes that define what type of trench is arranged adjacent to what type of mesa region. However, in the context of IGBTs, RC-IGBTs and MOSFETs, a plurality of different contacting schemes is known to the skilled person, and the embodiments described herein are not limited to specific contacting schemes.

For example, in accordance with the embodiments described herein, the load current conducting mesa region 105 is neighbored by the first trench 14 implemented as a gate trench and by the second trench 15 implemented as a source trench. If included, the further second trenches 15 of each power cell may include one or more of a dummy gate trench, a source trench and a floating trench.

The semiconductor body surface 100 may be covered by an insulation structure 17, 19 that has an opening 171 (cf. FIG. 1D) so as to allow an electrical connection between the first load terminal 11 and the mesa region 105.

The insulation structure 17, 19 can comprise or be composed of various electrically insulating materials. For example, the insulation structure 17, 19 can comprise or be composed an oxide and/or a low-k dielectric material. Further, the insulation structure 17, 19 may exhibit a thickness along the vertical direction Z of at least 200 nm, or of at least 400 nm, or of at least 450 nm. The insulation structure 17, 19 may comprise a plurality of insulating sublayers, e.g., a TEOS (tetraethyl orthosilicate) or a spin on glass (e.g. BPSG, Boron Phosphorus Silicate Glass) or another silicate glass sublayer or another oxide sublayer. Further aspects of the insulation structure 17, 19 will be explained below.

The insulation structure 17, 19 is arranged above the semiconductor body surface 100 and may have a plurality of openings 171, wherein the first load terminal 11 may extend into the openings 171 to contact both the semiconductor source region 101 and the semiconductor body region 102 of the mesa regions 105 of the power cells.

For example, as illustrated in FIG. 2B, the electrical contact between the first load terminal 11 and the mesa region 105 can be realized as a flat contact which can be essentially arranged co-planarily with the semiconductor body surface 100.

In another embodiment, as schematically and exemplarily illustrated in FIG. 2A, the electrical contact between the first load terminal 11 and the mesa region 105 can be realized by employing a contact groove 111 that extends from the level of the semiconductor body surface 100 along the vertical direction Z into the mesa region 105. For example, such contact grooves 111 may be etched into the semiconductor body 10 and later be filled with an electrically conductive material.

If implemented, the contact groove 111 may extend further into the semiconductor body 10 along the vertical direction Z than the source region 101. The contact groove 111 may be etched, e.g., before or after forming the source region 101 by means of implantation, as described further below.

The semiconductor source region 101 can be based on a first implantation material or a group of first implantation materials. The semiconductor body region 102 can be based on a second implantation material or a group of second implantation materials. Hence, for forming the semiconductor source region 101 and the semiconductor body region 102, one or more implantation processing steps may be carried out. The implantation processing steps may be combined with one or more thermal diffusion steps (herein also referred to as thermal annealing steps).

Aspects described herein relate to forming the mesa region 105 including the semiconductor source region 101 and the semiconductor body region 102 by means of at least one implantation processing step in a way that allows more reliably achieving a proper electrical contact between the first load terminal 11 and the mesa region 105.

For example, according to an embodiment, a method of forming a power semiconductor device comprises: providing a semiconductor body having a semiconductor body surface; forming an auxiliary layer above the semiconductor body surface, the auxiliary layer being coupled to the semiconductor body and having an auxiliary layer surface; forming a plurality of trenches, the trenches extending from the auxiliary layer surface along a vertical direction through the auxiliary layer into the semiconductor body, wherein two trench sidewalls facing to each other of two adjacent ones of the trenches laterally confine a mesa region of the semiconductor body along a first lateral direction, wherein both adjacent trenches comprise a respective trench section protruding out of the semiconductor body surface against the vertical direction by a protrusion distance of at least 50 nm; filling the trenches with at least one trench filler material; planarizing the at least one trench filler material to expose the auxiliary layer; removing the auxiliary layer at least partially while maintaining the protruding trench sections comprising the at least one trench filler material; subjecting the mesa region to an implantation processing step for forming a semiconductor zone in the mesa region, wherein the implantation is tilted with respect to the vertical direction by an angle of at least 10°, and wherein the protruding trench sections of the adjacent trenches serve at least partially as a mask during the tilted implantation.

Figure 1A:
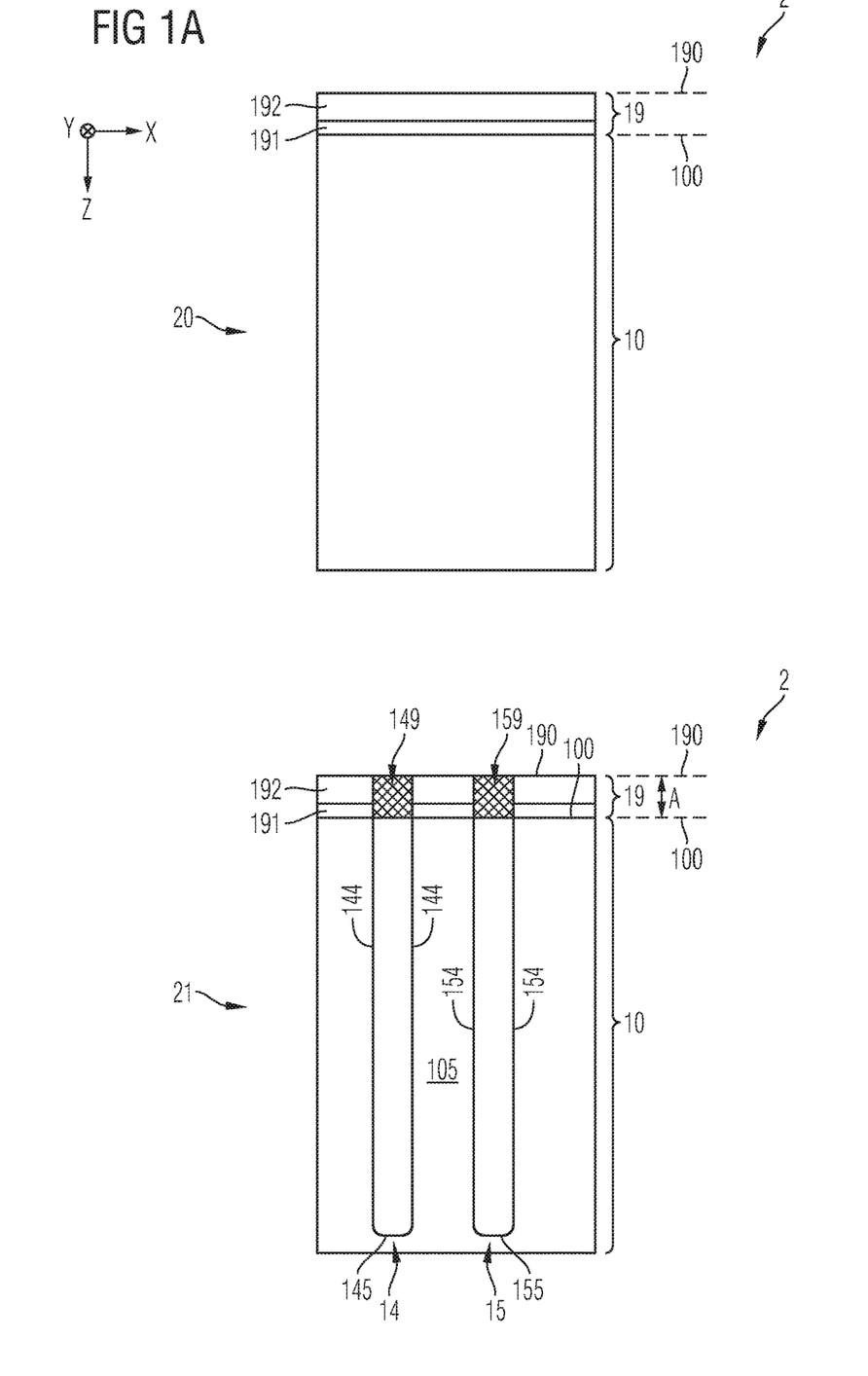
FIGS. 1A-1D schematically and exemplarily illustrate a method of processing a power semiconductor device in accordance with one or more embodiments.

For example, now referring to FIG. 1A, providing (step 20) the semiconductor body 10 having the surface 100 may occur in the usual manner known to skilled person. The semiconductor body 10 can be provided as a part of a semiconductor wafer.

Still referring to step 20, an auxiliary layer 19 is formed above the semiconductor body surface 100, the auxiliary layer 19 being coupled to the semiconductor body 10 and having an auxiliary layer surface 190. The auxiliary layer 19 can comprise a first sublayer 191 in contact with the semiconductor body surface 100 and a second sublayer 192 above the first sublayer 191. The first sublayer 191 may be different from the second sublayer 192; for example, the first sublayer 191 and the second sublayer 192 are formed by means of separate processing steps. The first sublayer 191 may be an oxidation layer. The second sublayer 192 can be formed by depositing a second sublayer material. At least one of the first sublayer 191 and the second sublayer 192 may be electrically insulating. For example, both the first sublayer 191 and the second sublayer 192 are electrically insulating. Hence, the auxiliary layer 19 may be an electrically insulating auxiliary layer 19. For example, the first sublayer 191 comprises an oxide. The second sublayer 192 may comprise silicon nitride (SiN). The second sublayer 192 can have a thickness in the vertical direction Z of at least 50 nm, of at least 100 nm, or of at least 250 nm. For example, the thickness of the second sublayer 192 is greater than the thickness of the first sublayer 191. The first sublayer 191 may be a thin oxide layer having thickness within the range of some nm, e.g., within the range of 5 nm to 15 nm, for example. In another embodiment, the auxiliary layer 19 may comprise more than two sublayers.

Forming the plurality of trenches 14, 15 (cf. step 21) may occur in the usual manner known to the skilled person. The trenches 14, 15 extend from the auxiliary layer surface 190 along a vertical direction Z through the auxiliary layer 19 into the semiconductor body 10, wherein two trench sidewalls 144, 154 facing to each other of two adjacent ones of the trenches 14, 15 laterally confine a mesa region 105 of the semiconductor body 10 along the first lateral direction X. Both adjacent trenches 14, 15 comprise a respective trench section 149, 159 protruding out of the semiconductor body surface 100 against the vertical direction Z by a protrusion distance A of at least 50 nm.

Forming the trenches 14, 15 may include carrying out one or more etch processing steps, wherein both the auxiliary layer 19 (including, for example, the first sublayer 191 and the second sublayer 192) and the semiconductor body 10 are exposed to the one or more etch processing steps. Hence, the trench sidewalls 144 and 154 extend along the vertical direction Z but only within the semiconductor body 10, but also within the auxiliary layer 19. Along the vertical direction Z, the trenches 14, 15 may be confined by a respective trench bottom 145 and 155.

The total vertical extensions of the trenches 14 and 15 may be identical to each other and can be within the range of 1 µm to 15 µm, e.g. approximately 5 µm. This total vertical extension can be measured as the distance between the auxiliary layer surface 190 and the respective trench bottom 145/155.

In an embodiment, the widths along the first lateral direction X of the trenches 14 and 15 within the auxiliary layer 19 are at least substantially corresponding to the widths along the first lateral direction X of the trenches 14 and 15 within the semiconductor body 10.

For example, the protrusion distance A is at least substantially identical to the thickness of the auxiliary layer 19, i.e., at least substantially identical to the distance along the vertical direction Z between the auxiliary layer surface 190 and the semiconductor body surface 100. According to the above-mentioned exemplary thicknesses of the auxiliary layer 19, this protrusion distance A can amount to at least 50 nm, to at least 100 nm, or to at least 250 nm.

Figure 1B:
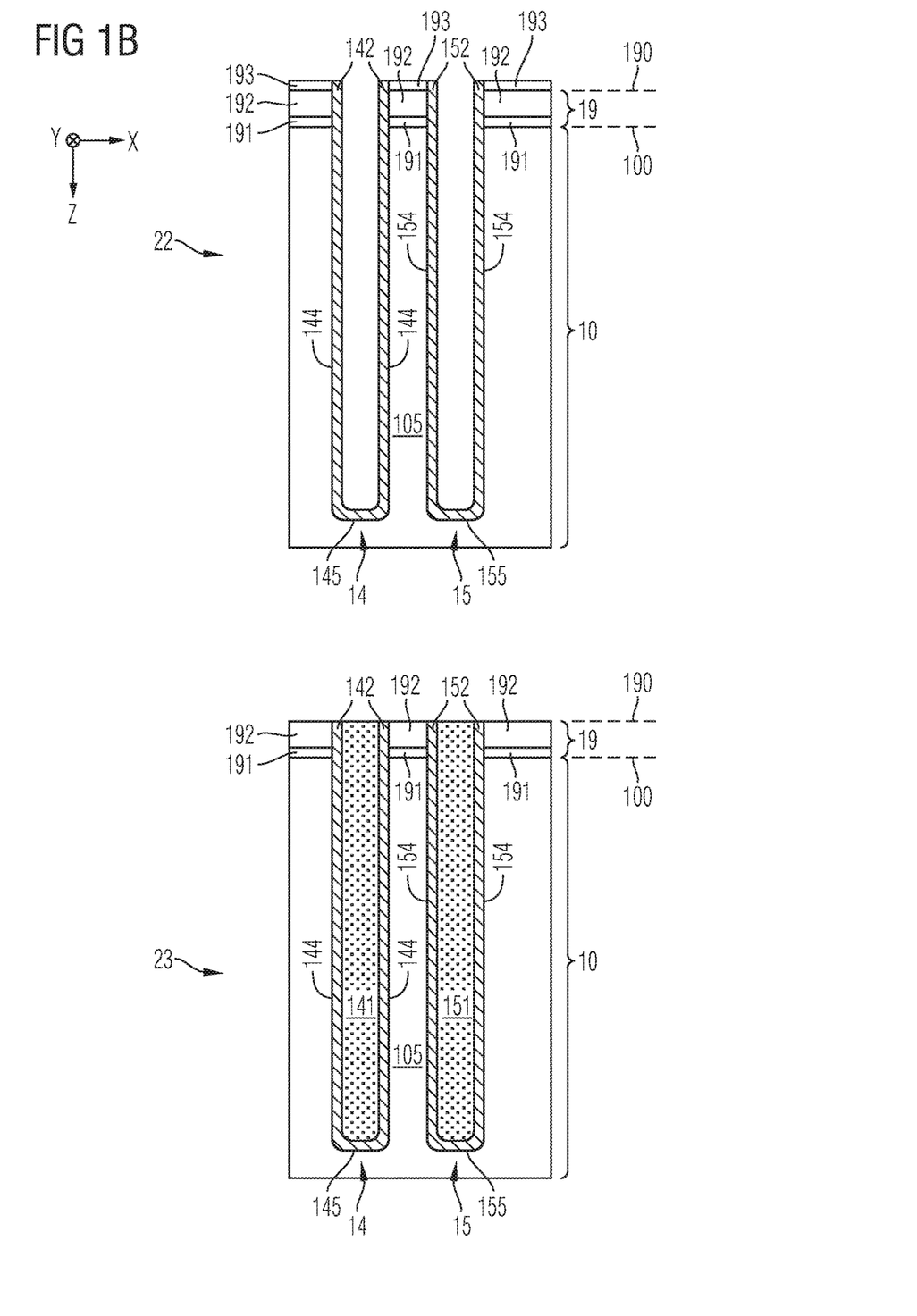

Now referring to FIG. 1B, once the trenches 14, 15 have been formed, e.g. by applying said one or more etch processing steps, the trenches 14, 15 can be filled with at least one trench filler material, which is illustrated in steps 22 and 23. Filling (steps 22, 23) the trenches 14, 15 with the at least one trench filler material can comprise forming trench electrodes 141, 151 in the trenches 14, 15, wherein the trench electrodes 141,151 form a part of the protruding trench sections 149, 159 and protrude from the semiconductor body surface 100 against the vertical direction Z by said protrusion distance A.

As explained above, the protrusion distance A can amount to at least 50 nm, at least 100 nm or at least 250 nm. For example, the protrusion distance A amounts to at least half of the width of the mesa region 105 in the first lateral direction X, e.g., measured at a vertical level where also the semiconductor source region 101 (cf. FIGS. 2A/B) is present.

However, before the trench electrodes 141 and 151 are formed, filling the trenches 14, 15 may comprise forming a respective trench insulator 142/152 in the trenches 14 and 15. For example, this can be achieved by carrying out at least one of an oxidation processing step and a deposition processing step. For example, within the scope of this trench filling step, a further sublayer 193 can be formed on top of the auxiliary layer 19, wherein the further sublayer 193 seamlessly joins with the trench insulators 142 and 152. That is, the further sublayer 193 and the trench insulators 142, 152 may be formed by means of the same processing step(s).

Further, before or after the trench electrodes 141 and 151 have been formed, the method may include carrying out at least one planarizing processing step so as to expose the auxiliary layer 19, namely its auxiliary layer surface 190, which is illustrated in step 23. Hence, it shall be understood that filling the trenches 14, 15 may include at least two separate steps, and forming the trench insulators 142, 152 and forming the trench electrodes 141, 151, wherein the step of planarizing may be carried out between these two separate steps or thereafter. For example, the step of planarizing may include removing, entirely or at least partially, the third sublayer 193.

For example, during the planarizing processing step, both the first sublayer 191 and the second sublayer 192 are maintained, wherein the thickness of the second sublayer 192 may be slightly reduced, e.g., by some 5 nm to 20 nm, due to the planarization. However, even after the planarization, the thickness of the second sublayer 192 may amount to at least 50 nm to at least 100 nm or to at least 200 nm.

Further, it shall be understood that the formulation "filling the trenches" can mean that the trenches 14, 15 are entirely filled, e.g., by means of the trench insulators 142, 152 and the trench electrodes 141, 151. In another embodiment, the trenches 14, 15 are not entirely filled. For example, it is within the scope of the present embodiments that one or more void spaces may be left within the trenches 14, 15, e.g., a void space in at least one of the trench electrodes 141, 151. However, the formulation "filling the trenches", with respect to all embodiments described herein, may imply that both the trench insulators 142, 152 and the trench electrodes 141, 151 extend from the semiconductor body surface 100 against the vertical direction Z so as to fill, at least partially, said protruding trench sections 149, 159. That is, in accordance with the embodiments described herein, both the trench insulators 142, 152 and the trench electrodes 141, 151 may protrude out of the semiconductor body surface 100 against the vertical direction Z by substantially said protrusion distance A of at least 50 nm, at least 100 nm or at least 250 nm. As indicated above, said distance may be measured as the distance between the auxiliary layer surface 190 (which may have been slightly levelled down due to the planarization) and the semiconductor body surface 100.

Figure 1C:
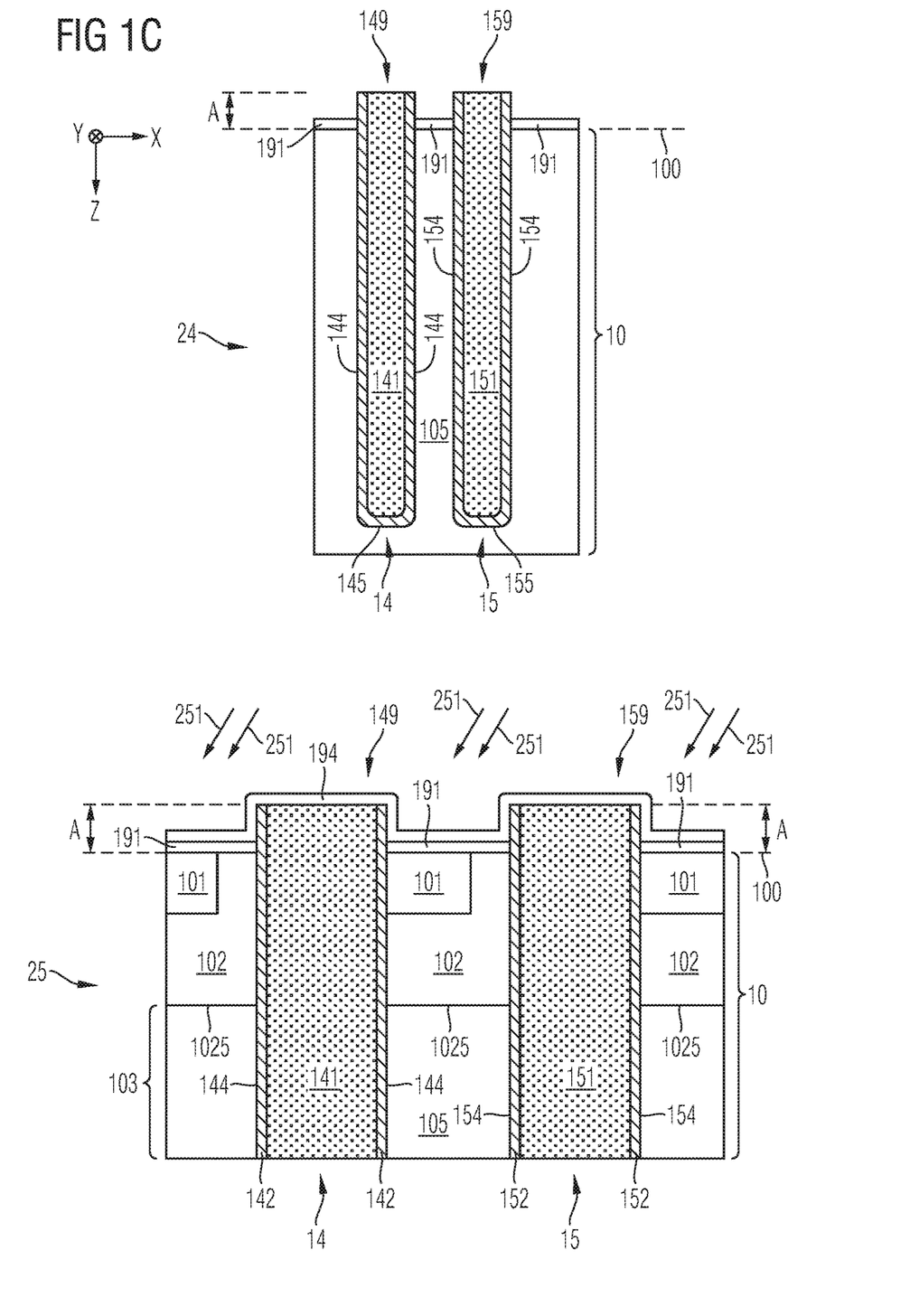

Now referring to FIG. 1C, the method of processing the power semiconductor device may be continued by removing (cf. step 24) the auxiliary layer 19 at least partially while maintaining the protruding trench sections 149, 159 which comprise the at least one trench filler material, e.g., said sections of the trench insulators 142, 152 and said sections of the trench electrodes 141, 151. For example, partially removing the auxiliary layer 19 may comprise removing only the second sublayer 192, while maintaining both the first sublayer 191 and the trench insulators 142, 152 which protrude out of the semiconductor body 10, as illustrated in step 24 of FIG. 1C. Such partial removing of the auxiliary layer 19 may for example include a selective etch processing step, e.g., an isotropic etch processing step.

The next processing stage (cf. steps 25) is directed to forming one or more semiconductor zones/regions in the mesa region 105. For example, this stage 25 includes forming a semiconductor source region 101 of a first conductivity type and a semiconductor body region 102 of the second conductivity type in the mesa region 105.

As already indicated above, the semiconductor source region 101 can be based on a first implantation material or a group of first implantation materials. The semiconductor body region 102 can be based on a second implantation material or a group of second implantation materials. Hence, for forming the semiconductor source region 101 and the semiconductor body region 102, one or more implantation processing steps may be carried out. The implantation processing steps may be combined with one or more thermal annealing steps.

Forming the semiconductor body region 102 of the second conductivity type in the mesa region 105 may involve standard processes known to skilled person, such as a first blanket (i.e., not masked with respect to the mesa regions) implantation processing step, e.g., a non-tilted implantation. During formation of the body region 102 by means of implantation, which may occur, e.g., after partial removal of the auxiliary layer 19 and before carrying out the tilted (source) implantation 251, the first sublayer 191 can remain and serve as stray oxide, e.g., so as to ovoid effects generally known as channeling.

Irrespective of how the semiconductor body region 102 is formed, in accordance with some or all embodiments described herein and, before carrying out the next processing steps to follow the body region formation process, it can be ensured that the surface of the semiconductor body region 102 in the mesa region 105 forms, at least partially or entirely, the mesa region surface. Further, it shall be noted that further processing steps may be carried out at a later stage to further modify the body region 102, e.g., by carrying out a masked or unmasked body contact implantation so as to provide for a high dopant concentration of the body region 102 in a section that later interfaces with the first load terminal 11 or, respectively, with said contact groove 111 mentioned with respect to FIGS. 2A/B, namely said body contact region 1021.

Before or after the body region 102 has been formed (usually: after the body region 102 has been formed), the mesa region 105 is subjected to an implantation processing step 25 for forming a semiconductor zone 101 in the mesa region 105, wherein the implantation 251 is tilted with respect to the vertical direction Z by an angle of at least 10°, of at least 20°, of at least 35° or of at least 45°, wherein the protruding trench sections 149, 159 of the adjacent trenches 14, 15 serve at least partially as a mask during the tilted implantation, as exemplarily illustrated in FIG. 1C.

For example, the tilting angle applied during the implantation 251 for forming the semiconductor zone 101 may be within the range of 10° to 60°, wherein the semiconductor wafer and/or the implantation device can be tilted so as to achieve said tilting angle.

For example, during the tilted implantation 251, only the first sublayer 191 of the auxiliary layer 19 is present above the mesa regions 105. Before or after the tilted implantation, the first sublayer 191 and the protruding trench sections 149 and 159 may be covered by an additional sublayer 194. For example, the additional sublayer 194 is provided before the tilted implantation, wherein the additional sublayer 194 may comprise an insulating material. E.g., the additional sublayer 194 acts as a liner or spacer. It is clear to the skilled person that the sublayer 194 can influence the geometry during implantation 251 and therefore may define the lateral position and size of the semiconductor zone 101 with respect to the trenches 14 and 15.

For example, only the protruding trench sections 149, 159 (and, optionally, the additional sublayer 194), are used as a mask regarding the first lateral direction X during the implantation 251 for forming the semiconductor zone 101, but no additional or, respectively, "lithographic mask". In fact, the protruding trench sections 149, 159 (and, optionally, the additional sublayer 194) are not a mask in the strict sense, but serve as a mask in combination with the tilted implantation 251. However, it shall be understood, as indicated further above, that the semiconductor zone 101 may be structured along the second lateral direction Y. Hence, for achieving such structure along the second lateral direction Y, a corresponding mask may be used during the tilted implantation 251.

In an embodiment, the implantation 251 is carried out such that the semiconductor zone 101 is arranged adjacent to only one of the two trench sidewalls, e.g. adjacent to only the trench sidewall 144 and spatially displaced along the first lateral direction X from the other one of the trench sidewalls, e.g., trench sidewall 154, as also exemplarily illustrated in FIG. 1C. Such spatial displacement is achieved due to the protruding trench sections 149, 159 that serve at least as a mask basis (they may be covered by said additional sublayer 194) and the tilted implantation 251. Hence, the amount of the spatial displacement from the other trench sidewall (154 with respect to the middle mesa region 105 in FIG. 1C) can be adjusted by adjusting at least one of the tilting angle applied during the tilted implantation 251 (a greater tilting angle leading to a greater spatial displacement along the first lateral direction X) and the protrusion distance A (a greater protrusion distance A leading to a greater spatial displacement along the first lateral direction X).

For example, the protrusion distance A and the tilting angle are set such that the semiconductor zone 101 extends for no more than 80%, for no more than 70% or for no more than 60% of the width of the mesa region 105 along the first lateral direction X. as indicated above, this may be achieved by carrying out the implantation 251 so as to not subject a subportion of the mesa region 105 adjacent to the other of said two trench sidewalls 154 to the implantation 251. This subportion may include a section of the mesa region that is "shadowed" due to one or more of the protruding trench sections 149, 159.

For example, the semiconductor zone 101 is the semiconductor source region of the first conductivity type. The following, it will hence be referred to as the semiconductor source region 101. As further explained above, the semiconductor body region 102 may be formed before the semiconductor source region 101. For example, the semiconductor body region 102 is not structured with respect to the mesa region 105, and the semiconductor body region 102 may be exposed to the tilted implantation 251. That is, the semiconductor body region 102 may extend along the entire width of the mesa region 105 the first lateral direction X, and can be arranged in contact with both trench sidewalls 144, 154 that laterally confine the mesa region 105.

Figure 1D:
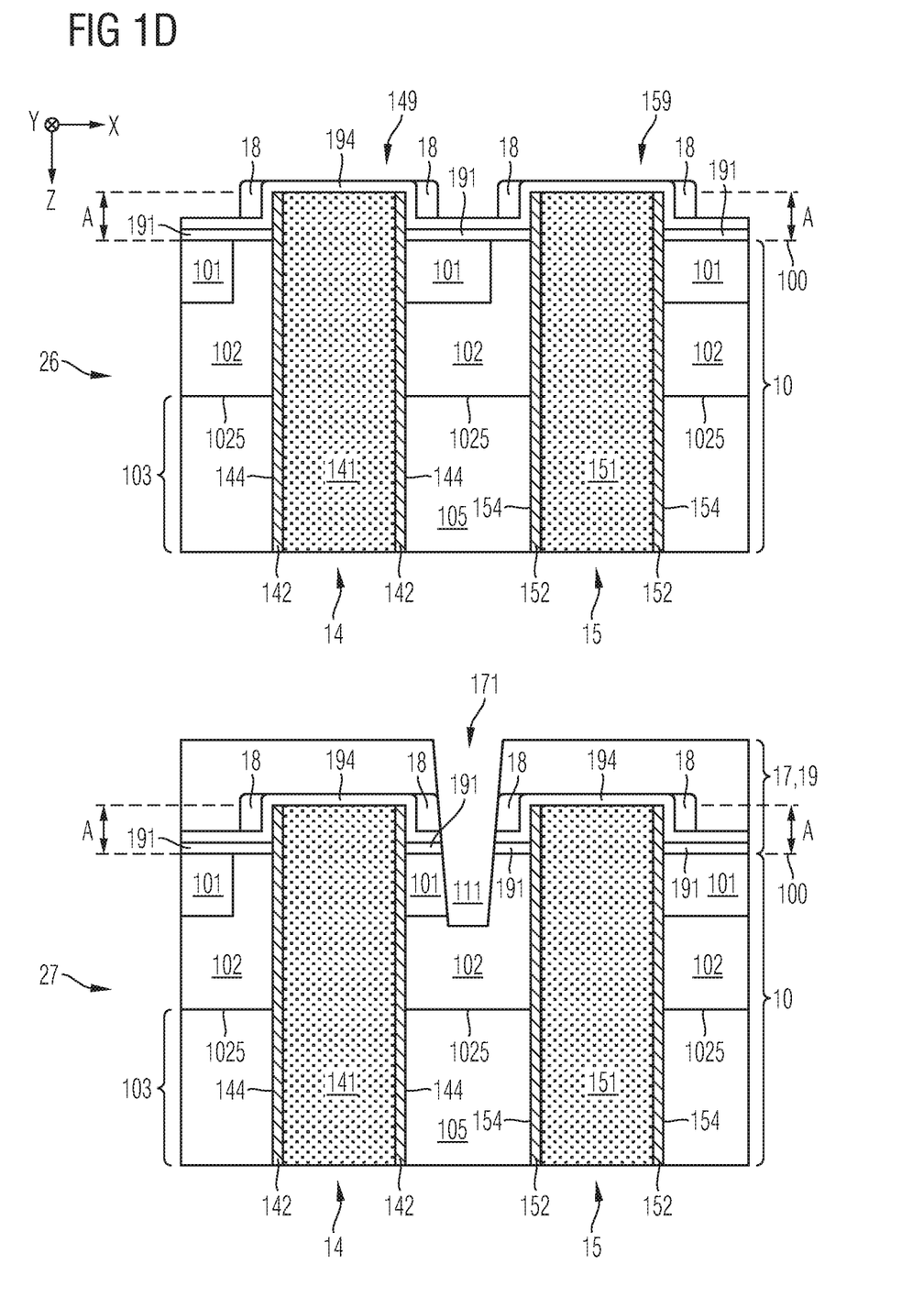

Now referring to FIG. 1D, the method may further include, at stage 26, forming, between the adjacent trenches 14, 15, a contact groove 111 that extends into the mesa region 105 along the vertical direction Z (FIG. 1D, FIG. 2A) or only down to the semiconductor body surface 100 (FIG. 2B, e.g., terminating at the semiconductor body surface 100). For example, the contact groove 111 extends about as far along the vertical direction Z as compared to the source region 101 or further than the source region 101, e.g., so as to interface with both the source region 101 and the body region 102.

Still referring to stage 26, forming the contact groove 111 may include forming spacer elements 18 laterally adjacent to the protruding trench sections 149, 159. If previously formed, the spacer elements 18 may be arranged laterally adjacent to the first sublayer 194, as exemplarily illustrated. Forming the spacer elements 18 may occur in accordance with one or more processing steps known to skilled person, which may include depositing a spacer element material and subsequently carrying out an anisotropic etch processing step such that only the illustrated spacer elements 18 remain. For example, forming the spacer elements 18 in accordance with the self-aligned process can comprise a conformal deposition processing step (e.g., over the whole wafer surface) and a subsequent anisotropic (e.g., dry) etch processing step.

For example, the spacer elements 18 comprise or are made of silicon nitride SiN, e.g., so as to facilitate later selective dry etching.

Hence, with respect to the trench positions and also with respect to the mesa region positions, the spacer elements 18 are self-aligned; i.e., with respect to the active region of the semiconductor device which includes the one or more power cells, no mask needs to be employed for forming the spacer elements 18. In short words: the spacer elements 18 may be formed by means of a self-aligned process with respect to the protruding trench sections 149, 159, in accordance with one or more embodiments.

For example, after the spacer elements 18 have been formed, a contact implantation (e.g., non-tilted) can be carried out for producing the body contact region 1021 (cf. FIG. 2A). However, with respect to FIG. 2B, it shall be noted that also the body contact region 1021 may be formed by means of a tilted implantation, e.g., a tilted implantation that is tilted against the tilting direction applied during the tilted (source) implantation 251, wherein also during the contact implantation, the protruding trench sections 149, 159 together with the optional spacer elements 18 serve as a mask.

Referring to stage 27, forming the contact groove 111 may include forming an intermediate insulation layer 17 over the protruding trench sections 149, 159. The intermediate insulation layer 17 may later serve as an isolation to (and/or, as a support for) an electrically conductive material that forms the first load terminal 11, which will be explained in more detail further below.

For example, forming the contact groove 111 (FIG. 2A) may involve multiple etching steps, for instance a first etching step to etch down to the spacer elements 18, a second etching step which is selective to these spacer elements 18 (i.e., does not etch them but only removes the isolation material 17) and etches down to the surface 100 of the mesa region 105, and a third, optional etching step forming a defined contact groove in the mesa region 105.

As exemplarily shown in FIGS. 2A and 2B, the shape and the depth of the contact groove 111 can vary. However, in accordance with embodiments described herein, the processing method results in the contact groove 111 which is self-aligned to the trench sidewalls 144, 145, and which has a CD (critical dimension) defined by the spacer elements 18 when in contact with the mesa region 105 and which can be placed in the middle/in the center of the mesa region with respect to the first lateral direction X.

Accordingly, forming the contact groove 111 may include at least one etch processing step for causing formation of an opening 171 through the intermediate insulation layer 17. The opening 171 is laterally confined by the spacer elements 18 and extends into the mesa region 105, thereby forming the contact groove 111. The at least one etch processing step may be or, respectively, include a selective etch processing step that does not etch away the spacer elements 18. Hence, with respect to the explanation above regarding the spacer elements 18, formation of the contact groove 111 may be carried out in accordance with self-aligned process. The position of the contact groove 111, at least with respect to the first lateral direction X, is defined by the spacer elements 18. That is, the etch processing step carried out for forming the openings 171 must not necessarily be structured with a pitch accuracy necessary for the contact groove 111, but may be structured with less accuracy, ensuring that only the opening defined by the two adjacent spacer elements 18 above the mesa region 105 will be subjected to the etching.

In an embodiment, the contact groove 111 is independent from overlay errors of a lithographic mask process, but self-aligned to the mesa region 105 and the trench sidewalls 144, 154, which may imply that the contact groove 111 is placed centrally with respect to the width of the mesa region 105. The thickness of the spacer elements 18 may define the distance and size of the opening 171.

With reference to FIG. 2A, which schematically and exemplarily shows an intermediate result of the method of processing the semiconductor device described herein and which has already been explained above, a subsequent processing step may include forming the first load terminal 11 by depositing an electrically conductive material above the intermediate insulation layer 17. The electrically conductive material extends into the contact 111 so as to electrically contact the semiconductor source region 101. For example, the electrically conductive material that is in contact with both the semiconductor source region 101 and the semiconductor body region 102 (e.g., with the body contact region 1021). Above the intermediate insulation layer 17, the deposited electrically conductive material may form an electrically conductive layer 112.

As illustrated by means of FIGS. 2A/B, the contact groove 111 can be formed as a flat contact (FIG. 2B) that reaches down from the electrically conductive layer 112 along the vertical direction Z to the semiconductor body surface 100, or as mesa region penetrating contact (FIG. 2A) that extends further along the vertical direction Z into the mesa region 105. Yet, both variants of the contact groove 111 can be formed in accordance with said self-aligned process.

With respect to FIG. 2B, it shall again be noted that also the body contact region 1021 may be formed by means of a tilted contact implantation, e.g., a tilted implantation that is tilted against the tilting direction applied during the tilted (source) implantation, wherein also during the tilted contact implantation, the protruding trench sections 149, 159 may serve as a mask, as during the tilted source implantation 251.

Presented herein are not only the above explained exemplary embodiments of the power semiconductor device processing method, but also embodiments of a power semiconductor device itself.

Generally, embodiments of a power semiconductor device are presented, wherein the power semiconductor device comprises a semiconductor body, the semiconductor body being coupled to a first load terminal and a second load terminal and configured to conduct a load current between said terminals, wherein the power semiconductor device further comprises: a first trench and a second trench that extend into the semiconductor body along a vertical direction, wherein both trenches comprise respective trench sidewalls, wherein the trench sidewalls facing to each other laterally confine a mesa region of the semiconductor body along a first lateral direction; a respective trench electrode; a respective trench section protruding out of a surface of the semiconductor body against the vertical direction by a protrusion distance of at least 50 nm, wherein the trench electrodes extend into the protruding trench sections; a source region of a first conductivity type and a semiconductor body region of a second conductivity type, both regions being arranged in the mesa region adjacent to a trench sidewall of the first trench, wherein the first trench is configured for inducing an inversion channel in the body region to control a load current in the mesa region, wherein the source region is arranged adjacent to only one of the two trench sidewalls and spatially displaced along the first lateral direction from the other one of the two trench sidewalls.

FIGS. 2A-B illustrated schematically and exemplarily embodiments of such a power semiconductor device 1, which have generally already been explained above. It is a common feature of both embodiments illustrated that the respective trench sections 149, 159 protrude out of the surface 100 of the semiconductor body 10 against the vertical direction Z by the protrusion distance A of at least 50 nm, at least 100 nm or of at least 250 nm, wherein the trench electrodes 141, 151 extend into the protruding trench sections 149, 159; and that the source region 101 is arranged adjacent to only one of the two trench sidewalls 144 and spatially displaced along the first lateral direction X from the other one of the two trench sidewalls 154.

With respect to the above description of the embodiments of the power semiconductor device processing method, it has already been explained how the protruding trench sections 149, 159 as well as the "one-sided" semiconductor source region 101 may come into being. Hence, regarding optional implementations of these aspects of the power semiconductor device 1, it is referred to the description above.

For example, in accordance with an embodiment of the power semiconductor device 1, the intermediate insulation layer 17 can be arranged above the protruding trench sections 149, 159 and between, with respect to the vertical direction Z, the semiconductor body 10 and the electrically conductive layer 112 of the first load terminal 11.

Further, the contact groove 111 can be arranged between, with respect to the first lateral direction X, the trenches 14, 15, and filled with an electrically conductive material and extending from the electrically conductive layer 112 through the intermediate insulation layer 19 into the mesa region 105 (cf. FIG. 2A) or to the semiconductor body surface 100 (cf. FIG. 2B) along the vertical direction Z so as to electrically contact both the semiconductor source region 101 and the semiconductor body region 102.

For example, the contact groove 111 and the parts of the trench electrodes 141, 151 that extend into the protruding trench sections 149, 159 have a common extension range in the vertical direction Z of at least 50 nm, at least 100 nm or of at least 250 nm. This common extension range may be substantially identical to the above described protrusion distance A. For example, this common extension range may be present (e.g., exclusively) above the semiconductor body surface 100.

If the contact groove 111 extends into the mesa region 105 (cf. FIG. 2A), it may separate the mesa region 105 into a first lateral section 1051 and second lateral section 1052, the first lateral section 1051 being arranged between, with respect to the first lateral direction X, the first trench 14 and the contact groove 111, and the second lateral section 1052 being arranged between, with respect to the first lateral direction X, the second trench 15 and the contact groove 111, wherein the source region 101 extends only into the first lateral section 1051 and not into the second lateral section 1052. Hence, the source region 101 extends for no more than 80%, for no more than 70% or for no more than 60% of the width of the mesa region 105, and is arranged adjacent to only trench sidewall 144 and spatially displaced from trench sidewall 154, in accordance with an embodiment.

Further, in accordance with an embodiment, the contact groove 111 can be arranged in contact with spacer elements 18 that are positioned laterally adjacent to the protruding trench sections 149, 159, as explained above.

Figure 3:
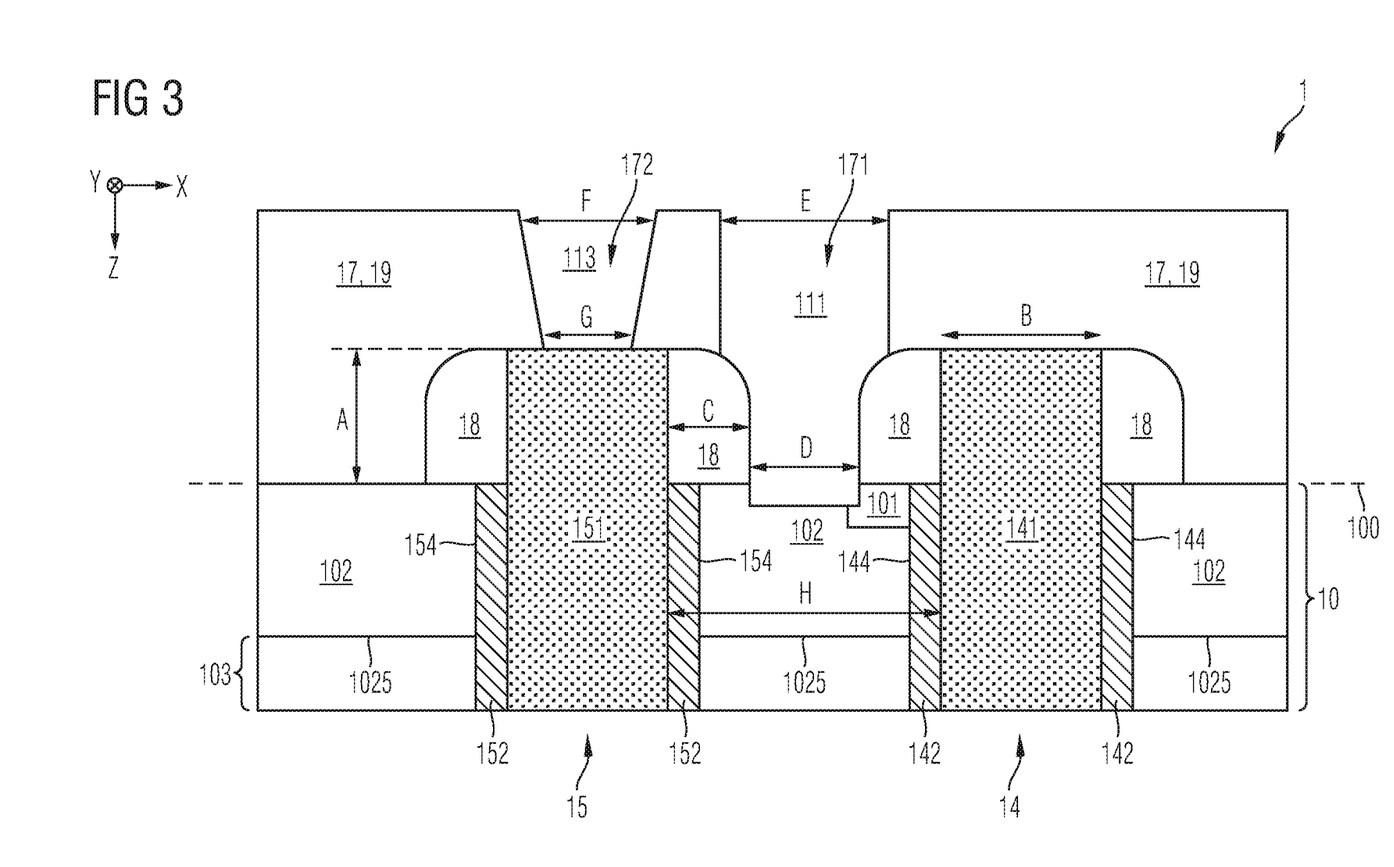
FIG. 3 schematically and exemplarily illustrates a section of a vertical cross-section of a power semiconductor device in accordance with one or more embodiments.

With respect to FIG. 3, which schematically and exemplarily illustrates a section of a vertical cross-section of the power semiconductor device 1 in accordance with one or more embodiments, some exemplary dimensions shall be explained:

In this drawing (where the auxiliary layer 17 and the intermediate layer 19 are illustrated as a joint structure for simplicity reasons), A denotes the protrusion distance, as explained above;

B denotes the width of the trench electrode 141 (also the trench electrode 151);

C denotes the width of the spacer element 18;

D denotes the width of the effective substrate contact (i.e., the width of the electrically conductive material that fills the contact groove 111 and is in contact with the mesa region 105;

E denotes the width of the opening of the mask used for forming the opening 171;

F denotes the width of a further opening of the mask used for forming a further contact hole 172 used for contacting the trench electrode 151 of the second trench 15

(e.g., a source trench) by means of a further contact groove 113 which may be filled with the electrically conductive material;

G denotes the width of the further contact groove 113 at the interface with the trench electrode 151;

H denotes the sum of the width of the mesa region 105 and the trench insulator 152 and trench insulator 142.

For example, embodiments of the power semiconductor device 1 described herein may fulfill one or more or all of the following expression:

$$E > D \quad \text{(i)}$$

$$F > G \quad \text{(ii)}$$

$$D = H - 2*C \quad \text{(iii)}$$

$$C <= A \quad \text{(iv)}$$

$$E < H - \text{CD/OVL(overlay) margin} \quad \text{(v)}$$

It shall be understood that the contact grooves 111 and 113 must not necessarily be implemented with overlapping ranges in the second lateral direction. Rather, it is e.g., possible to contact the trench electrode 151 elsewhere. Of course, also a (non-illustrated) further contact groove can be provided for contacting the trench electrode 141 of the first trench 14.

In the above, embodiments pertaining to power semiconductor switches and corresponding processing methods were explained. For example, these semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a power semiconductor device, the method comprising:

providing a semiconductor body having a semiconductor body surface;

forming an auxiliary layer above the semiconductor body surface, the auxiliary layer being coupled to the semiconductor body and having an auxiliary layer surface;

forming a plurality of trenches extending from the auxiliary layer surface along a vertical direction through the auxiliary layer into the semiconductor body, wherein two trench sidewalls facing each other of two adjacent ones of the trenches laterally confine a mesa region of the semiconductor body along a first lateral direction, wherein both adjacent trenches comprise a respective trench section protruding out of the semiconductor body surface against the vertical direction by a protrusion distance of at least 50 nm;

filling the trenches with at least one trench filler material;

planarizing the at least one trench filler material to expose the auxiliary layer;

removing the auxiliary layer at least partially while maintaining the protruding trench sections comprising the at least one trench filler material; and subjecting the mesa region to an implantation processing step for forming a semiconductor zone in the mesa region, wherein the implantation is tilted with respect to the vertical direction by an angle of at least 10°, and wherein the protruding trench sections of the adjacent trenches serve at least partially as a mask during the tilted implantation.

2. The method of claim 1, wherein the implantation is carried out such that the semiconductor zone is arranged adjacent to only one of the two trench sidewalls and spatially displaced along the first lateral direction from the other one of the two trench sidewalls.

3. The method of claim 1, wherein the semiconductor zone extends for no more than 80% of a width of the mesa region along the first lateral direction.

4. The method of claim 1, wherein the semiconductor zone is a source region of a first conductivity type, the method further comprising:

forming a semiconductor body region of a second conductivity type in the mesa region, wherein the semiconductor body region of the second conductivity type is subjected to the implantation.

5. The method of claim 4, wherein the semiconductor body region of the second conductivity type extends along an entire width of the mesa region in the first lateral direction and is arranged in contact with both of the trench sidewalls.

6. The method of claim 1, wherein the implantation is carried out so as to not subject a subportion of the mesa region adjacent to the other of the two trench sidewalls to the implantation.

7. The method of claim 1, wherein filling the trenches with at least one trench filler material comprises forming trench electrodes in the trenches, wherein the trench electrodes form a part of the protruding trench sections and protrude from the semiconductor body surface against the vertical direction by at least 50 nm.

8. The method of claim 1, further comprising:
after removing the auxiliary layer at least partially and before carrying out the implantation for forming the semiconductor zone, covering the protruding trench sections with an insulating material.

9. The method of claim 1, further comprising:
forming, between the adjacent trenches, a contact groove extending into the mesa region along the vertical direction or to the semiconductor body surface.

10. The method of claim 9, wherein forming the contact groove comprises:
forming spacer elements laterally adjacent to the protruding trench sections.

11. The method of claim 10, wherein the spacer elements are formed by a self-aligned process with respect to the protruding trench sections.

12. The method of claim 10, further comprising:
forming an intermediate insulation layer above the protruding trench sections, wherein forming the contact groove includes at least one etch processing step for causing an opening through the intermediate insulation layer, the opening being laterally confined by the spacer elements and extending into the mesa region, thereby forming the contact groove.

13. The method of claim 12, further comprising:
forming a first load terminal of the power semiconductor device by depositing an electrically conductive material above the intermediate insulation layer, the electrically conductive material extending into the contact groove so as to electrically contact the semiconductor zone.

14. The method of claim 11, wherein forming the spacer elements in accordance with the self-aligned process comprises a conformal deposition processing step and a subsequent anisotropic etch processing step.

15. The method of claim 10, wherein the spacer elements comprise silicon nitride.

16. The method of claim 1, wherein the two adjacent trenches are formed as: a control trench with a trench electrode configured for inducing an inversion channel in the mesa region to control a load current in the mesa region; and a source trench with a trench electrode electrically connected to a potential different from the potential of the control electrode.

17. The method of claim 1, wherein the auxiliary layer comprises a first sublayer in contact with the semiconductor body surface and a second sublayer above the first sublayer.

18. The method of claim 17, wherein the second sublayer comprises silicon nitride and/or wherein the second sublayer has a thickness in the vertical direction of at least 50 nm.

19. The method of claim 1, wherein only the protruding trench sections and no additional masks are used during the implantation for forming the semiconductor zone.

* * * * *

UNITED STATES PATENT AND TRADEMARK OFFICE
CERTIFICATE OF CORRECTION

PATENT NO. : 10,971,599 B2  
APPLICATION NO. : 16/545231  
DATED : April 6, 2021  
INVENTOR(S) : H. Thees Page 1 of 1

It is certified that error appears in the above-identified patent and that said Letters Patent is hereby corrected as shown below:

On the Title Page

Abstract (Line 13), please change "to least" to -- at least --.

Signed and Sealed this  
Seventeenth Day of August, 2021

Drew Hirshfeld  
*Performing the Functions and Duties of the*  
*Under Secretary of Commerce for Intellectual Property and*  
*Director of the United States Patent and Trademark Office*